(12) United States Patent
Yang et al.

(10) Patent No.: US 7,382,213 B2
(45) Date of Patent: Jun. 3, 2008

(54) MONOLITHICALLY INTEGRATED SWITCHABLE CIRCUITS WITH MEMS

(75) Inventors: Jeffrey M. Yang, Cerritos, CA (US); Matt Nishimoto, Torrance, CA (US); Gregory Rowan, Redondo Beach, CA (US); Kelly Tornquist, Torrance, CA (US); Patty Chang-Chien, Redondo Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 188 days.

(21) Appl. No.: 11/046,604

(22) Filed: Jan. 28, 2005

(65) Prior Publication Data

US 2006/0170514 A1 Aug. 3, 2006

(51) Int. Cl.
*H03H 7/38* (2006.01)
(52) U.S. Cl. .................... 333/33; 333/17.3
(58) Field of Classification Search ............ 333/33, 333/34, 17.3
See application file for complete search history.

(56) References Cited

U.S. PATENT DOCUMENTS 5,808,527 A * 9/1998 De Los Santos ............ 333/205
6,535,722 B1 * 3/2003 Rosen et al. ............. 455/188.2
6,992,543 B2 * 1/2006 Luetzelschwab et al. ..... 333/32

OTHER PUBLICATIONS

Huantong Zhang et al.; Mems Variable-Capacitor Phase Shifters Part I: Loaded-Line Phase Shifter; International Journal of RF and Microwave and Computer-Aided Engineering [Onling]; Jul. 1, 2003; pp. 321-337; vol. 13, No. 4; Wiley Periodicals, US.
Papapolymerou J et al.; Reconfigurable Double-Stub Tuners using MEMS Switches for Intelligent RF Front-Ends; IEEE Transactions on Microwave Theory and Techniques; Jan. 2003; pp. 271-278; vol. 1, No. 51, IEEE Service Center; Piscataway, NJ, US.

* cited by examiner

*Primary Examiner*—Stephen E Jones
(74) *Attorney, Agent, or Firm*—Patti, Hewitt & Arezina LLC

(57) ABSTRACT

A reconfigurable circuit and a related method for its use, the circuit including multiple microelectromechanical systems (MEMS) switches connected between selected points in the circuit. The MEMS switches are controlled to select a desired circuit condition, such as an impedance matching condition, and then the switch conditions may be fused permanently. In the context of an impedance matching circuit, the MEMS switches may be used to optimize matching after circuit fabrication or after packaging, thereby allowing optimization even after potentially performance changing events.

14 Claims, 1 Drawing Sheet

MONOLITHICALLY INTEGRATED SWITCHABLE CIRCUITS WITH MEMS

BACKGROUND OF THE INVENTION

This invention relates generally to circuits that are switchable or reconfigurable using MEMS (microelectromechanical systems) technology and, more particularly, to tunable impedance matching circuits using MEMS switches. In general, there are various types of electrical circuits for which reconfiguration is desired to maintain functionality or efficiency. MEMS switches, the states of which can be changed by the application of electrical signals, have often been proposed for use in highly reconfigurable circuits. Unfortunately, although MEMS components have negligible insertion loss in comparison with electronic switches, such as field-effect transistors (FETs), MEMS switches tend to be less reliable because their movable metal components are inherently subject to metal fatigue. In addition, when MEMS switches are called on to handle high power input, they are typically subject to "sticktion," i.e., to fusing in one switch position. A high electromagnetic field across the MEMS switch contacts induces arcing. There is, therefore, an inherent upper power limit for MEMS switches, above which the switches fuse in their current positions.

An important need for circuit reconfiguration arises in impedance matching of electronic components. Mismatched components, particularly those operating at radio frequencies (RF), are inefficiently coupled and the mismatch gives rise to a voltage standing wave in each component. The degree of mismatch may be expressed in terms of the voltage standing wave ratio (VSWR). This phenomenon is a key system performance degradation mechanism in many electronic systems, especially those operating at high frequencies. The phenomenon is often difficult to resolve and predict. Solutions employed prior to the present invention include placement of discrete high-value attenuators in a signal transmission path, or manually tuning the transmission path to minimize the adverse effect of the mismatch. These techniques are, however, undesirable because they are both costly and labor intensive to implement in a high-volume manufacturing environment. Accordingly, there is still a need for a technique for reconfiguring circuits, such as matching circuits, using MEMS devices, but without the disadvantages usually associated with them. The present invention satisfies this need.

SUMMARY OF THE INVENTION

The present invention resides in a monolithic integrated circuit capable of being conveniently reconfigured by microelectromechanical systems (MEMS) switches. The circuit may be designed for the purpose of impedance matching, or for any other purpose. Briefly, and its most general terms, the invention may be defined as a monolithic reconfigurable circuit, comprising an electrical circuit; a plurality of MEMS switches connected between selected points in the electrical circuit; means for generating control signals to the MEMS switches to set each of them in a selected state to achieve a desired circuit condition; and means for fusing the MEMS switches permanently in their selected states.

The means for fusing the MEMS switches may include means for temporarily applying high-power signals to the circuit, or means for temporarily heating the circuit. The means for generating control signals may include a circuit for applying control signals in parallel to all the MEMS switches simultaneously.

More specifically, the invention may be defined as a reconfigurable monolithic microwave integrated circuit (MMIC) comprising a plurality of MEMS switches connected between selected points in the MMIC; and means for generating control signals to the MEMS switches to set each of them in a selected state to achieve a desired circuit condition. In one embodiment of the MMIC, the desired circuit condition can be changed from time to time by generating an additional set of control signals to the MEMS switches. In an alternative embodiment, the circuit of the invention also comprises means for fusing the MEMS switches permanently in their selected states. Thus the MEMS switches may be used in a volatile mode or a non-volatile mode.

Even more specifically, the invention may take the form of a reconfigurable impedance matching circuit, comprising a transmission line extending between input and output terminals of the impedance matching circuit; a plurality of stub impedances connected between selected points in the transmission line and a common ground; a plurality of microelectromechanical systems (MEMS) switches connected in series with respective stub impedances, permitting disconnection of selected ones of the stub impedances; and means for generating control signals to the MEMS switches to set each of them in a selected state to achieve a desired impedance matching condition. Depending on its power requirements, the impedance matching circuit may be repeatedly optimized by applying new settings to the MEMS switches, or the switches may be fused in an optimum state.

Finally, the invention may be defined in method terms. In its broadest terms, the invention is a method for reconfiguring an electrical circuit, the method comprising the steps of connecting a plurality of MEMS switches between selected points in the electrical circuit; generating control signals to the MEMS switches to set each of them in a selected state to achieve a desired circuit condition; and fusing the MEMS switches permanently in their selected states. The method as applied in the context of impedance matching comprises the steps of connecting a transmission line between input and output terminals of the impedance matching circuit; connecting a plurality of stub impedances between selected points in the transmission line and a common ground; connecting a plurality of microelectromechanical systems (MEMS) switches in series with the respective stub impedances, to permit selective activation of the stub impedances; and generating control signals to the MEMS switches to set each of them in a selected state to achieve a desired impedance matching condition. The step of generating control signals to the MEMS switches may be performed repeatedly to optimize the impedance matching performance of the circuit, or the method may include the step of fusing the MEMS switches permanently in their selected states.

It will be appreciated from the foregoing that the present invention represents a significant advance in the field of reconfigurable circuits, especially circuits operating at high frequencies, such as MMICs. In particular, the invention provides a technique for optimizing circuit performance by applying appropriate signals to MEMS switches integrated into the circuitry, and provides the option of fusing the MEMS switches to preserve the optimum settings at some convenient point in the manufacturing and packaging of the circuit. Other aspects and advantages of the invention will become apparent from the following more detailed description, taken in conjunction with the accompanying drawings.

DETAILED DESCRIPTION OF THE INVENTION

Figure 1:
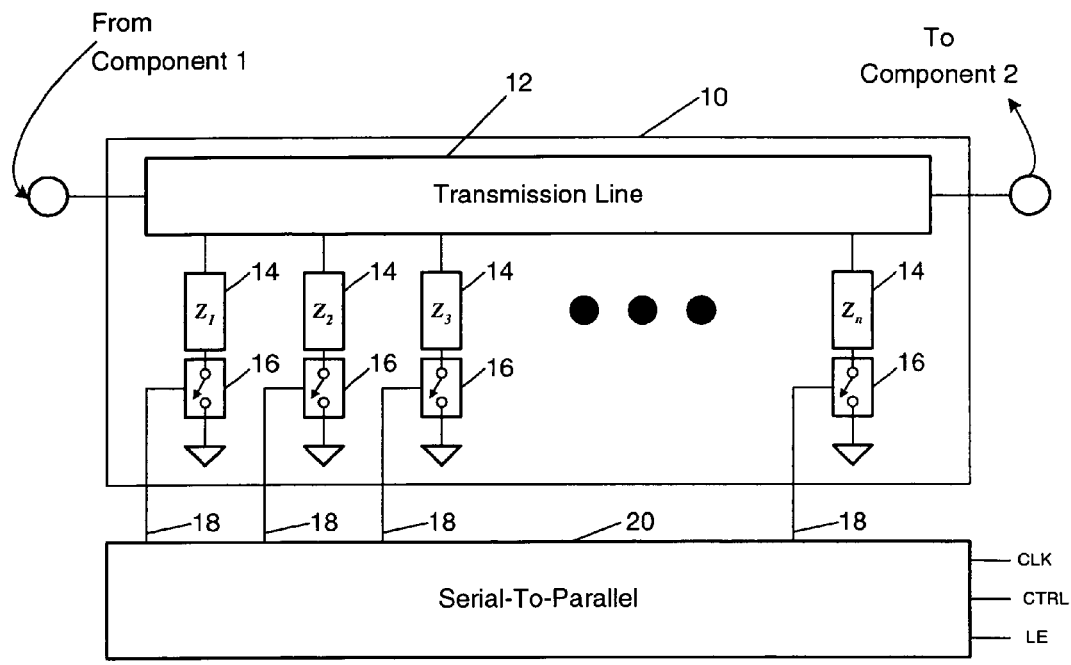
FIG. 1 is block diagram of a reconfigurable impedance matching network, in accordance with the present invention, suitable for use high frequencies.

As shown in the drawings for purposes of illustration, the present invention is concerned with reconfigurable circuits using MEMS (microelectromechanical systems) switches. In particular, the invention is concerned with configuration of an impedance matching circuit known as a stub-tuned transmission line, which is shown diagrammatically in FIG. 1. The stub-tuned transmission line, indicated generally by reference numeral 10, is intended to be connected between two electronic components (indicated as "component 1" and "component 2") for the purpose of impedance matching the two components. The stub-tuned transmission line 10 includes a high-frequency transmission line 12 and a plurality of "stub" impedances 14 connected between points distributed along the transmission line, and ground. A total of n stub impedances 14 are shown, designated as having impedances $Z_1$, $Z_2$, $Z_3$, and so forth to $Z_n$. The impedances 14 in general may be capacitors, inductors or some combination of the two, and will inherently include a resistive component. If the impedances 14 are correctly selected in relation to the characteristic impedance or the transmission line 12 and to the impedances "seen" by the matching circuit in connecting to "component 1" and "component 2," the circuit performs the desired impedance matching function of the two interfacing components.

A significant difficulty with using discrete impedances for impedance matching is that variations that can occur during fabrication of the matching circuit, and during fabrication of the circuit components being matched, can result in degradation in the performance of the matching circuit, simply because the theoretical design parameters of the discrete impedances 14 or the transmission line 12 are not always accurately reproduced by the manufacturing process. Moreover, the degree of impedance mismatch between the two circuit components is also subject to change by fabrication of these components. Thus there is typically a need to optimize the impedance matching network after fabrication, which is impossible or extremely difficult if discrete impedance components are used. A related difficulty is that installing the matching circuit in a package housing also affects circuit performance. Therefore, there is also a need to optimize the matching network after the final packaging step.

In the stub-tuned transmission line 10 of FIG. 1, each of the stub impedances 14 has a series switch 16 that can be electrically operated to activate or deactivate the corresponding impedance, and thereby tune the matching circuit for optimum performance. In the presently preferred embodiment of the invention, the switches 16 are MEMS switches controlled by electrical signals on separate lines 18. The MEMS switches may, for example, be made in accordance with the teachings of U.S. Pat. No. 6,218,911 to Kong et al., entitled "Planar Airbridge RF Terminal MEMS Switch." Basically, when an electrostatic force is applied to one of the switches 16, a metal beam integrated into the switch is deformed into contact, or away from contact, with a metal trace in the switch. In the switch as disclosed in the Kong patent, the deformable metal beam is formed in the same plane as the other metal traces in the switch, and the beam is deflected laterally, in substantially the same plane as the other metal traces.

Control signals on the lines 18 are generated as parallel outputs from a serial-to-parallel converter 20, which receives the control signals in a serial stream that is clocked into the converter. When a set of n control signals is ready for output, they are simultaneously clocked out onto the control lines 18.

An important aspect of the invention is that the MEMS switches 16 may be operated in a volatile or a non-volatile mode, depending on the impedance matching application. The volatile mode is suitable only for relatively low power applications, because higher RF powers applied to the circuit 10 have the effect of fusing the MEMS switches 16. At relatively low powers, the switches 16 may be configured after fabrication and reconfigured after installation in a housing or at a later time. For operation at higher powers, the switches may be permanently fused by the application of these higher powers, or alternatively by raising the temperature of the device.

Figure 2:
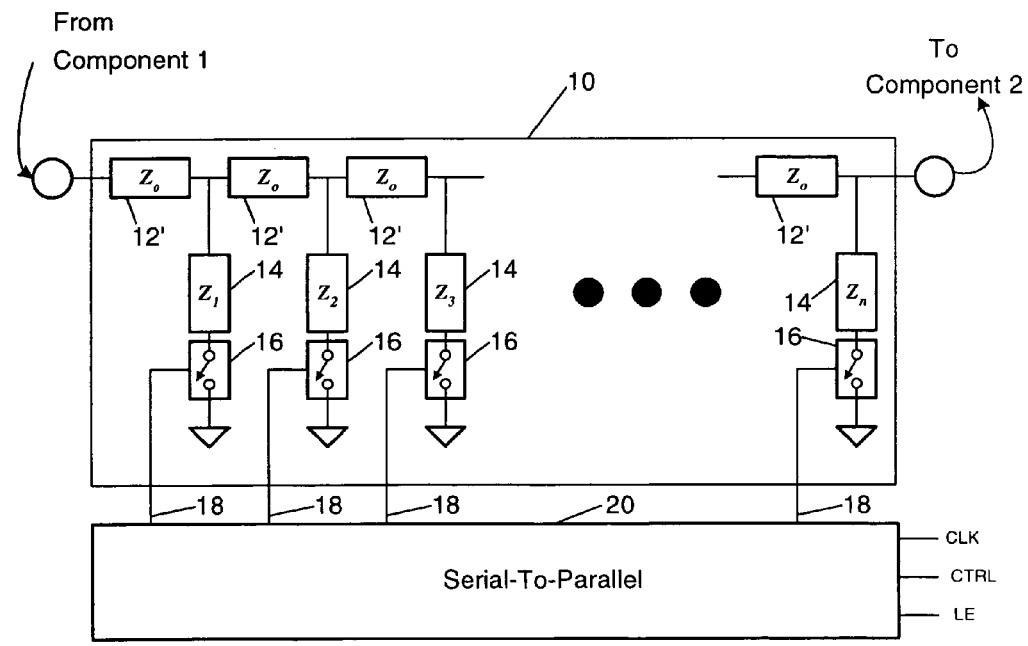
FIG. 2 is a block diagram similar to FIG. 1 but using lumped impedances instead of a transmission line with distributed impedance, and suitable for use at lower frequencies.

For operation at lower frequencies, the circuit 10 may be implemented in a slightly different form, as shown in FIG. 2. Instead of a high-frequency transmission line 12, this configuration includes a plurality of series-connected lumped impedances 12', each indicated as having an impedance value of $Z_0$. Operation of this version of the impedance matching circuit 10 is basically the same as for the FIG. 1 version. The switches 16 are programmable by signals on the control lines 18, generated in the serial-to-parallel converter 20. This optimization process may be effected in real time, by continually changing the switch settings to optimize the impedance matching function. When the switch configuration produces the desired impedance matching performance, the configuration may be made permanent by fusing the switches, either by applying higher power to the circuit or by raising its temperature. Depending on the application of the circuit, fusing the switches may be effected after fabrication or after installation in a housing (not shown).

Fusing the switches 16 by the application of higher power turns what was previously regarded as a disadvantage into an advantage. Previously, fusing MEMS switches was avoided by keeping the power below a designated threshold. In the context of the present invention, the power limit is avoided and fusing the switches is embraced as a convenient way of permanently fixing a desired switch configuration in memory. Moreover, the invention avoids the complexity associated with prior techniques for optimizing impedance matching.

The serial-to-parallel converter 20 may be fully integrated with the impedance matching circuit 10 if the circuit is used in lower power applications, in which the circuit may be used repeatedly to optimize the switch settings. Alternatively, the converter 20 may be removed once the settings of the switches 16 have been made permanent, since there is no longer any need to supply control signals to the switches.

A key advantage of the invention is that because VSWR minimization is achieved by impedance matching, the invention incurs minimum insertion loss while greatly enhancing system performance. Another advantage is that manual tuning can be completely avoided because the optimization process lends itself to computer control. Moreover, as mentioned above, optimization can be performed as a post-processing step or as a post-packaging step. Therefore, better processing yield is obtained because any performance degradation due to process variation can be taken into account during the optimization process, and degradation due to packaging can be eliminated by optimizing after packaging. It must again be emphasized that rendering the optimized state of the device non-volatile reduces overall system complexity because no further optimization is possible or needed after fusing the switches 16. Finally, because the structure of the invention is compact, it can be conveniently fabricated using monolithic techniques.

It will be appreciated from the foregoing that the present invention represents a significant advance in the field of reconfigurable circuitry. In particular, the invention provides a novel approach to producing an impedance matching circuit having a programmable switch configuration that can be optimized after fabrication or even after installation in a housing. It will also be appreciated that although specific embodiments of the invention have been described in detail by way of example, various modifications may be made without departing from the spirit and scope of the invention. Accordingly, the invention should not be limited except as by the appended claims.

The invention claimed is:

1. A method for reconfiguring an electrical circuit, the method comprising the steps of:
   connecting a plurality of microelectromechanical systems (MEMS) switches between selected points in the electrical circuit;
   generating control signals to the MEMS switches to set each of them in a selected state to achieve a desired circuit condition; and
   fusing the MEMS switches permanently in their selected states;
   wherein the step of generating control signals further comprises the step of applying the control signals in parallel to the plurality of MEMS switches simultaneously; and
   wherein the step of fusing is effected after fabrication of the electrical circuit or after installation of the electrical circuit in a housing.

2. The method of claim 1, wherein the step of fusing the MEMS switches further comprises the step of applying high-power signals to the circuit temporarily.

3. The method of claim 1, wherein the step of fusing the MEMS switches further comprises the step of heating the circuit temporarily.

4. The method of claim 1, wherein the step of applying the control signals in parallel to the plurality of MEMS switches simultaneously further comprises the steps of:
   receiving a serial stream; and
   converting the serial stream to parallel control signals.

5. A method for reconfiguring a monolithic microwave integrated circuit (MMIC), the method comprising the steps of:
   connecting a plurality of microelectromechanical systems (MEMS) switches between selected points in the MMIC;
   generating control signals to the MEMS switches to set each of them in a selected state to achieve a desired circuit condition; and
   fusing the MEMS switches permanently in their selected states;
   wherein the step of generating control signals further comprises the step of applying the control signals en parallel to the plurality of MEMS switches simultaneously; and
   wherein the desired circuit condition can be changed from time to time by generating an additional set of control signals to the MEMS switches; and
   wherein the step of fusing is effected after fabrication of the MMIC circuit or after installation of the MMIC circuit in a housing.

6. The method of claim 5, wherein the step of applying the control signals in parallel to the plurality of MEMS switches simultaneously further comprises the steps of:
   receiving a serial stream; and
   converting the serial stream to parallel control signals.

7. The method of claim 5, further comprising the step, of;
   fusing the MEMS switches permanently in their selected states.

8. The method of claim 7, wherein the step of fusing the MEMS switches further comprises the step of applying high-power signals to the MMIC temporarily.

9. The method of claim 7, wherein the step of fusing the MEMS switches further comprises the step of heating the circuit temporarily.

10. A method for reconfiguring an impedance matching circuit, the method comprising the steps of:
    connecting a transmission line between input and output terminals of the impedance matching circuit;
    connecting a plurality of stub impedances between selected points in the transmission line and a common ground;
    connecting a plurality of microelectromechanical systems (MEMS) switches in series with the respective stub impedances, to permit selective activation of the stub impedances;
    generating control signals to the MEMS switches to set each of them in a selected state to achieve a desired impedance matching condition;
    fusing the MEMS switches permanently in their selected states; and
    applying the control signals in parallel to the plurality of MEMS switches simultaneously;
    wherein the step of fusing is effected after fabrication of the impedance matching circuit or after installation of the Impedance matching circuit in a housing.

11. The method of claim 10, wherein the step of generating control signals to the MEMS switches is performed repeatedly to optimize impedance matching performance.

12. The method of claim 10, wherein the step of fusing the MEMS switches further comprises the step of applying high-power signals to the impedance matching circuit temporarily.

13. The method of 10, wherein the step of fusing the MEMS switches further comprises the step of heating the impedance matching circuit temporarily.

14. The method of claim 10, wherein the transmission line is implemented as a plurality of series-connected lumped impedances.

* * * * *